(12) United States Patent  (10) Patent No.: US 9,385,241 B2
Lee et al.  (45) Date of Patent: Jul. 5, 2016

(54) ELECTROSTATIC DISCHARGE (ESD) PROTECTION CIRCUITS, INTEGRATED CIRCUITS, SYSTEMS, AND METHODS FOR FORMING THE ESD PROTECTION CIRCUITS

(75) Inventors: Shu-Chuan Lee, Hsinchu (TW); Kuo-Ji Chen, Taipei County (TW); Wade Ma, Taitung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 722 days.

(21) Appl. No.: 12/766,186

(22) Filed: Apr. 23, 2010

(65) Prior Publication Data

US 2011/0006342 A1   Jan. 13, 2011

Related U.S. Application Data

(60) Provisional application No. 61/223,866, filed on Jul. 8, 2009.

(51) Int. Cl.
| | |
|---|---|
| *H01L 23/62* | (2006.01) |
| *H01L 29/861* | (2006.01) |
| *H01L 27/02* | (2006.01) |
| H01L 29/16 | (2006.01) |
| H01L 29/20 | (2006.01) |

(52) U.S. Cl.
CPC .......... *H01L 29/861* (2013.01); *H01L 27/0277* (2013.01); *H01L 29/1608* (2013.01); *H01L 29/2003* (2013.01)

(58) Field of Classification Search
CPC ..................... H01L 27/0266; H01L 27/0251
USPC ........................................ 257/173, 355, 360
See application file for complete search history.

(56) References Cited

U.S. PATENT DOCUMENTS

| | | | | |
|---|---|---|---|---|
| 4,602,267 A * | 7/1986 | Shirato | ............... | H01L 27/0259 257/358 |
| 4,996,626 A * | 2/1991 | Say | ................................. | 361/56 |
| 5,304,827 A * | 4/1994 | Malhi | ................. | H01L 29/7835 257/262 |
| 5,559,352 A * | 9/1996 | Hsue et al. | ..................... | 257/328 |
| 5,960,290 A * | 9/1999 | Hsu | ..................... | H01L 27/0266 438/281 |
| 6,469,325 B1 * | 10/2002 | Ishizuka | ............. | H01L 27/0251 251/110 |
| 7,282,767 B2 * | 10/2007 | Duvvury | ............. | H01L 29/0619 257/355 |
| 7,605,435 B2 * | 10/2009 | Anderson | ............. | H01L 29/861 257/121 |
| 2002/0041007 A1 * | 4/2002 | Russ | ................... | H01L 27/0262 257/546 |

(Continued)

*Primary Examiner* — Jerome Jackson, Jr.
*Assistant Examiner* — David Chen
(74) *Attorney, Agent, or Firm* — Hauptman Ham, LLP

(57) ABSTRACT

An electrostatic discharge (ESD) protection circuit coupled with an input/output (I/O) pad is provided. The ESD protection circuit includes a first field oxide device coupled between a first terminal that is capable of providing a first supply voltage and the I/O pad. The first field oxide device includes a drain end having a first type of dopant and a source end having the first type of dopant. The first field oxide device includes a first doped region having a second type of dopant disposed adjacent to the drain end of the first field oxide device and a second doped region having the second type of dopant disposed adjacent to the source end of the first field oxide device.

18 Claims, 6 Drawing Sheets

(56) References Cited

U.S. PATENT DOCUMENTS

| | | | |
|---|---|---|---|
| 2003/0173622 A1* | 9/2003 | Porter et al. | 257/355 |
| 2003/0223164 A1* | 12/2003 | Ebara | 361/56 |
| 2004/0053471 A1* | 3/2004 | Kikuchi | H01L 29/0626 438/286 |
| 2004/0099890 A1* | 5/2004 | Umimoto et al. | 257/288 |
| 2005/0012155 A1* | 1/2005 | Ker | H01L 27/0266 257/355 |
| 2005/0127445 A1* | 6/2005 | Ker et al. | 257/355 |
| 2005/0133871 A1* | 6/2005 | Ker et al. | 257/355 |
| 2006/0043489 A1* | 3/2006 | Chen | H01L 27/0255 257/355 |
| 2006/0097321 A1* | 5/2006 | Kim | H01L 27/0262 257/355 |

* cited by examiner

ELECTROSTATIC DISCHARGE (ESD) PROTECTION CIRCUITS, INTEGRATED CIRCUITS, SYSTEMS, AND METHODS FOR FORMING THE ESD PROTECTION CIRCUITS

CROSS-REFERENCE TO RELATED APPLICATIONS

The present application claims priority of U.S. Provisional Patent Application Ser. No. 61/223,866 filed on Jul. 8, 2009, which is incorporated herein by reference in its entirety.

TECHNICAL FIELD

The present disclosure relates generally to the field of semiconductor circuits, and more particularly, to electrostatic discharge (ESD) protection circuits, integrated circuits, systems, and methods for forming the ESD protection circuits.

BACKGROUND

ESD protection mechanisms generally work in two ways. First, by dissipating the ESD current transient safely using a low-impedance discharging channel that prevents thermal damages in the structures of the integrated circuit. Secondly, by clamping any ESD induced voltage to a safe level to avoid dielectric degradation or rupture. Ideally the complete ESD protection solution should be realized on the integrated circuit (IC) creating an effective discharging channel from any pin to every other pin on the integrated circuit.

Devices that are used as ESD protection elements include diodes, bipolar transistors, metal-oxide-semiconductor field effect transistors (MOSFETs), and silicon-controlled rectifiers (SCRs). SCRs function as switches that can be configured to turn on and shunt voltage from the input/output (I/O) pads of an integrated circuit to ground.

In ESD protection some integrated circuit elements may be vulnerable by discharges occurring within automated equipment, while others may be more prone to damage from handling by personnel. This can occur from direct transfer of electrostatic charge from the human body or from a charged material to the electrostatic discharge sensitive (ESDS) element. When one walks across a floor, an electrostatic charge accumulates on the body. Simple contact of a finger to the leads of an ESDS device or assembly allows the body to discharge, possibly causing device damage. The model used to simulate this event is the Human Body Model (HBM).

The HBM testing model represents the discharge from the fingertip of a standing individual delivered to the device. It is modeled by a 100 pF capacitor discharged through a switching component and a 1.5 kOhm (kΩ) series resistor into the component. Typically, integrated circuit designers would like to see protection from the HBM testing to be greater than 2,000 volts.

An electrostatic discharge can also occur from a charged conductive object, such as a metallic tool or fixture. To test for this, designers use the Machine Model (MM). The machine model consists of a 200 pF capacitor discharged directly into a circuit without a series resistor. Typically, integrated circuit designers would like to see protection from the machine model to be greater than 200 volts.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
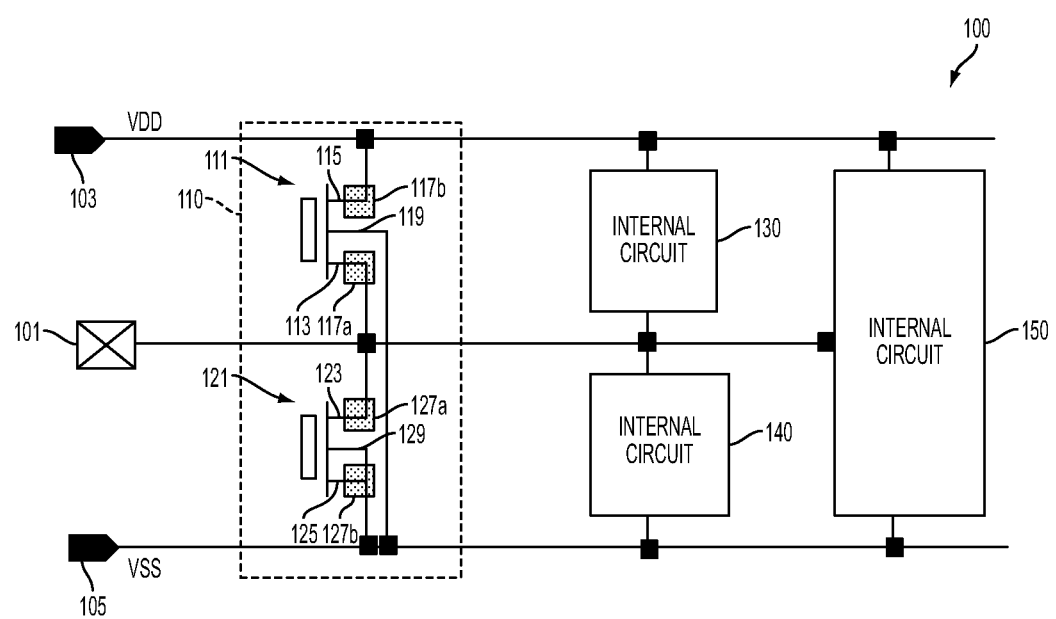
FIG. 1 is a schematic drawing illustrating an exemplary integrated circuit including an electrostatic discharge (ESD) protection circuit.

A conventional ESD protection circuit has an N-type field oxide device (N-FOD). The N-FOD is a semiconductor device consisting of n-p-n doped regions. One of the n-regions, i.e., drain region, is connected to an integrated circuit input/output (I/O) pad and the other n-region, i.e., source region, is connected to either VDD or VSS. Only is the drain region of the N-FOD abutted to a p+ doped region. The source region of the N-FOD is free from being adjacent to or connecting to a p+ doped region. During an ESD event, sufficient amount of charges build up on the I/O pad that causes the N-FOD to rapidly breakdown and conduct current with a low intrinsic resistance. The rapid conduction of the N-FOD discharges the ESD pulse on the I/O pad to VDD or VSS. The conduction of the N-FOD prevents the excessive charges to damage the integrated circuit.

However, if the integrated circuit is subjected to a negative-to-VDD (ND-mode) ESD stress test, the machine model (MM) of the integrated circuit may fail around −150 V that is much less than −200 V. Additionally, the integrated circuit may see a voltage drop of about −6 V. The −6V voltage drop can be higher than the operating voltage, e.g., 3.3 V or 5 V, of the integrated circuit. The −6V voltage drop may damage gate oxide of complementary metal-oxide-semiconductor (CMOS) transistors that are designed for operating under 3.3 V or 5 V.

Based on the foregoing, ESD protection circuits that can desirably improve the voltage of MM, integrated circuits, systems, and methods for forming the ESD protection circuits are desired.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing illustrating an exemplary integrated circuit including an electrostatic discharge (ESD) protection circuit. An integrated circuit 100 can include an input/output (I/O) pad 101. The I/O pad 101 can be coupled with an ESD protection circuit 110. The I/O pad 101 can be coupled to at least one internal circuit, e.g., internal circuits 130-150. The ESD protection circuit 110 can be configured to protect at least one of the internal circuits 130-150 from being damaged by ESD pulses occurring on the I/O pad 101. Each of the internal circuits 130-150 can include, for example, static random access memory (SRAM) array, an embedded SRAM array, dynamic random access memory (DRAM) array, an embedded DRAM array, a field-programmable gate array, a non-volatile memory, e.g., FLASH, EPROM, E$^2$PROME, a logic circuit, an analog circuit, other integrated circuit, and/or any combinations thereof. It is noted the number of the internal circuits 130-150 shown in FIG. 1 is merely exemplary. Less or more internal circuits can be disposed within the integrated circuit 100.

In some embodiments, the ESD protection circuit 110 can include at least one field oxide device (FOD), e.g., FODs 111 and 121. In some embodiments, the FOD 111 can be coupled between a terminal 103 that is capable of providing a supply voltage, e.g., VDD, and the I/O pad 101. The supply voltage VDD can be provided for operations of the internal circuits 130-150. In some embodiments, the supply voltage VDD can be 1.5 V, 1.8 V, 2.5 V, 3.3 V, 5 V, 9 V, 12 V, or any other voltage that is desired for the operations of the internal circuits 130-150. In other embodiments, the I/O pad 101 can have a voltage that can be higher than the supply voltage VDD. The FOD 121 can be coupled between another terminal 105 that is capable of providing a supply voltage, e.g., VSS or ground, and the I/O pad 101.

In some embodiments, the FOD 111 can include a drain end 113 having a first type of dopant, e.g., n-type dopant, and a source end 115 having the first type of dopant, e.g., n-type dopant. The FOD 111 can include a doped region 117a having a second type of dopant, e.g., p-type dopant. The doped region 117a can be disposed adjacent to the drain end 113 of the FOD 111. The FOD 111 can include another doped region 117b having the second type of dopant, e.g., p-type dopant. The doped region 117b can be disposed adjacent to the source end 115 of the FOD 111.

In some embodiments, the FOD 121 can include a drain end 123 having the first type of dopant, e.g., n-type dopant, and a source end 125 having the first type of dopant, e.g., n-type dopant. The FOD 121 can include a doped region 127a having the second type of dopant, e.g., p-type dopant. The doped region 127a can be disposed adjacent to the drain end 123 of the FOD 121. The FOD 121 can include another doped region 127b having the second type of dopant, e.g., p-type dopant. The doped region 127b can be disposed adjacent to the source end 125 of the FOD 121.

Referring again to FIG. 1, a bulk region 119 of the FOD 111 can be coupled with the terminal 105. A bulk region 129 of the FOD 121 can be coupled with the source end 125 of the FOD 121.

Figure 2:
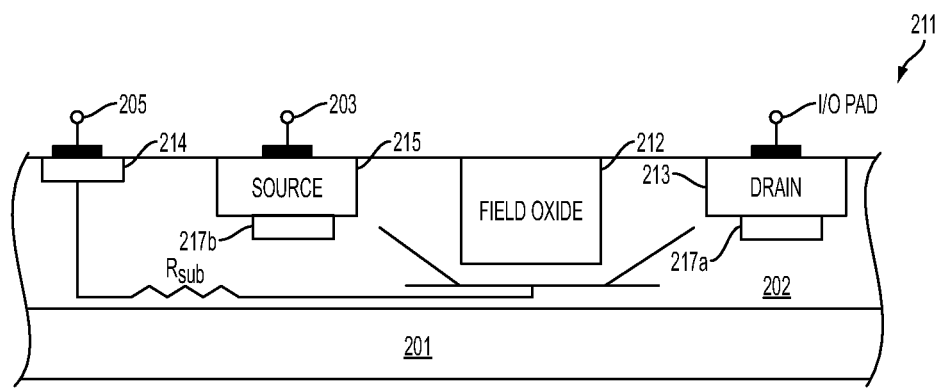
FIG. 2 is a schematic cross-sectional view illustrating a portion of an exemplary integrated circuit including a FOD.

FIG. 2 is a schematic cross-sectional view illustrating a portion of an exemplary integrated circuit including a FOD. Items of a FOD 211 in FIG. 2 that are the same items of the FOD 111 in FIG. 1 are indicated by the same reference numerals, increased by 100. In FIG. 2, the FOD 211 can be formed over a substrate 201, e.g., a p-type substrate. The substrate 201 can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

Referring to FIG. 2, a well region 202, e.g., a p-well region, can be disposed over or within the substrate 201. The well region 202 can be configured to provide a channel region of the FOD 211. For embodiments using an N-FOD, the well region 202 can be a p-type well region. For other embodiments using a P-FOD, the well region 202 can be an n-type well region.

Referring again to FIG. 2, a field oxide 212 can be disposed between the drain end 213 and the source end 215. The field oxide 212 can include a structure of a local oxidation of silicon (LOCOS), a shallow trench isolation (STI) structure, and/or any suitable isolation structure. A doped region 214 can be disposed within the well region 202. For embodiments using an N-FOD, the doped region 214 can be, for example, a p+ doped region. The doped region 214 can be coupled with the terminal 105 and configured to electrically connect to the well region 202.

As noted, for the conventional ESD protection circuit only is the n-type drain of the N-FOD of the conventional ESD protection circuit abutted to a p+ doped region. The n-type source of the N-FOD of the conventional ESD protection circuit is free from being contacted to a p+ doped region. It is found that under the ND-mode ESD stress test the MM of the internal circuit may fail around −150 V that is much less than −200 V.

In contrary to the N-FOD of the conventional ESD protection circuit, each of the drain end 213 and the source end 215 of the FOD 211 is disposed adjacent to a doped region 217a or 217b, e.g., p-type doped region. In some embodiments, the doped regions 217a and 217b can be disposed over the drain end 213 and source end 215, respectively. In other embodiments, the doped regions 217a and 217b can be disposed on sidewalls of the drain end 213 and source end 215, respectively. In still other embodiments, the doped regions 217a and 217b can be disposed around the drain end 213 and the source end 215, respectively. One of skill in the art can modify the locations of the doped regions 217a and 217b with respect to the drain end 213 and source end 217.

Table 1 provides experimental data regarding human body model (HBM), machine model (MM), and trigger voltage (V$_t$) of the N-FOD of the conventional ESD protection circuit and the FOD 211 if the internal circuit is subjected to a negative-to-VDD (ND-mode) ESD stress test. The trigger voltage means a voltage drop of the internal circuit may see, if an ESD pulse occurs at an I/O pad.

TABLE 1

|  | HBM | MM | $V_t$ |
|---|---|---|---|
| Conventional FOD | −2.5 kV | −150 V | −6 V |
| FOD 211 | −3.75 kV | −225 V | −5.2 V |

As shown in Table 1, it is unexpectedly found that the HBM and the MM of the FOD 211 are substantially larger than those of the conventional FOD that only has an n-type drain abutted to a p+ doped region. The HBM and the MM provided by the FOD 211 can increase by about −1.25 kV and −75 V, respectively. The high HBM and MM of the FOD 211 can desirably protect the internal circuit, e.g., internal circuit 130 shown in FIG. 1, from being damaged if the internal circuit is subjected to an ND-mode ESD stress test.

Comparing the trigger voltages of the conventional FOD and the FOD 211, it is found the trigger voltage of the FOD 211 can be lowered by around 0.8 V. The lower trigger voltage can desirably prevent the internal circuit from seeing a high voltage drop if an ESD event occurs. With the lower trigger voltage, transistors, devices, diodes, and/or circuits of the internal circuit can be substantially protected from being damaged during the ND-mode ESD stress test.

It is also found that the bulk (not labeled) of the FOD 211 can be coupled with the terminal 205. During a normal operation of the internal circuit, the supply voltage VSS can be applied to the terminal 205 and coupled with the bulk. During an ND-mode ESD stress test, the bulk of the FOD 211 coupled with the terminal 205 is floating. As noted, the drain end 213, the source end 215, and the bulk of the FOD 211 can constitute a parasitic bipolar junction transistor (BJT) having an emitter, a collector, and a base, respectively. During the ND-mode ESD stress test, the floating bulk, i.e., the base of the parasitic BJT, can desirably to pass charges flowing from the drain end 213 to the source end 215. The trigger voltage seen by the internal circuit can be desirably reduced.

Figure 3:
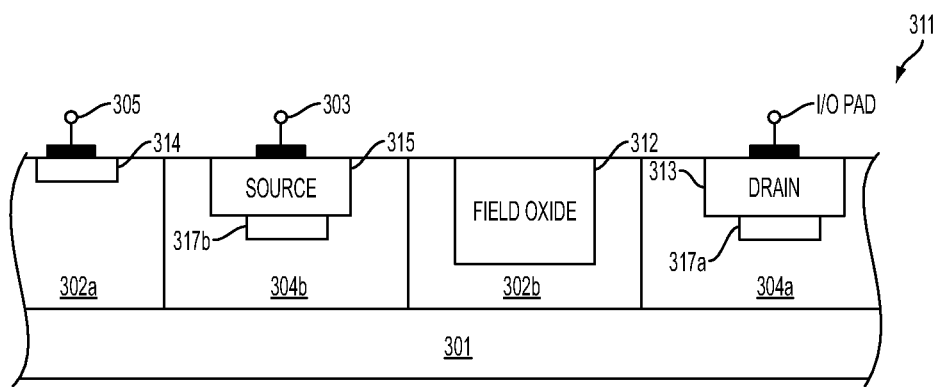
FIG. 3 is a schematic cross-sectional view of another exemplary FOD of an ESD protection circuit.

FIG. 3 is a schematic cross-sectional view of another exemplary FOD of an ESD protection circuit. Items of an FOD 311 in FIG. 3 that are the same items of the FOD 211 in FIG. 2 are indicated by the same reference numerals, increased by 100. In FIG. 3, well regions 302a and 302b can be similar to the well region 202. A doped region 317a, e.g., p+ doped region, can be coupled with a well region 304a, e.g., p-type well region. The doped region 317b, e.g., p+ doped region, can be coupled with a well region 304b, e.g., p-type well region. In some embodiments, the well regions 302a and 302b can have a dopant concentration that is different from that of the well regions 304a and 304b. In other embodiments, the well regions 304a and 304b can be referred to as high-voltage well regions, e.g., high-voltage P-well (HVPW) regions. The HVPW regions can be formed by, for example, an HVPW implantation process.

Figure 4:
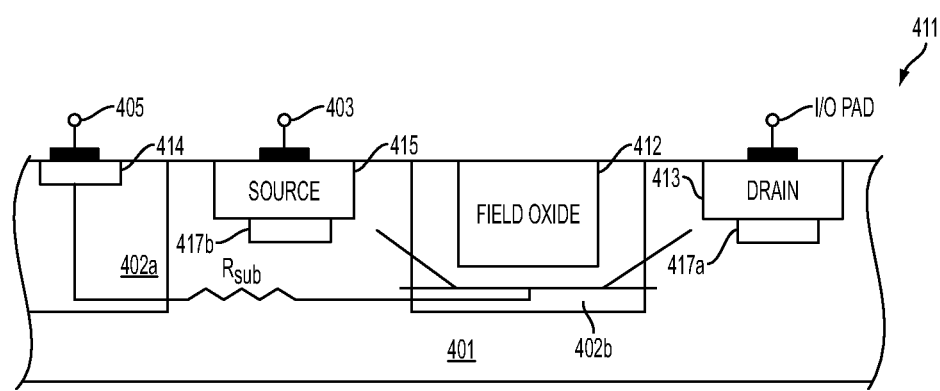
FIG. 4 is a schematic cross-sectional view of an exemplary FOD of an ESD protection circuit.

FIG. 4 is a schematic cross-sectional view of another exemplary FOD of an ESD protection circuit. Items of an FOD 411 in FIG. 4 that are the same items of the FOD 211 in FIG. 2 are indicated by the same reference numerals, increased by 100. In FIG. 4, well regions 402a and 402b can be similar to the well region 202. A doped region 417a, e.g., p+ doped region, and a doped region 417b, e.g., p+ doped region, can be coupled with a substrate 401, e.g., a p-type substrate. The substrate 401 can be disposed around a field oxide 412 of the FOD 411.

In some embodiments, the well region 402b can be disposed between the substrate 401 and the field oxide 412. The well region 402b can have a dopant concentration that can be higher than that of the substrate 401. The substrate 401 can provide a desired resistance $R_{sub}$ between the bulk of the FOD 411 and the doped region 414 coupled with the terminal 405. It is found that the desired resistance $R_{sub}$ of the substrate 401 can lower the trigger voltage that is seen by the internal circuit during the ND-mode ESD stress test.

Referring to FIG. 4, a parasitic diode can be found between the source end 415 and the substrate 401 and another parasitic diode can be found between the drain end 413 and the substrate 401. For embodiments using an N-FOD, the substrate 401 is the p-type end of the parasitic diodes. The parasitic diodes can be referred to as native diodes. Compared with a diode using a p-well region as the p-type end, the native diodes using the substrate 401 as the p-type end can have a lower parasitic capacitance. With a lower parasitic capacitance, an operating speed of an internal circuit can be desirably achieved.

Figure 5:
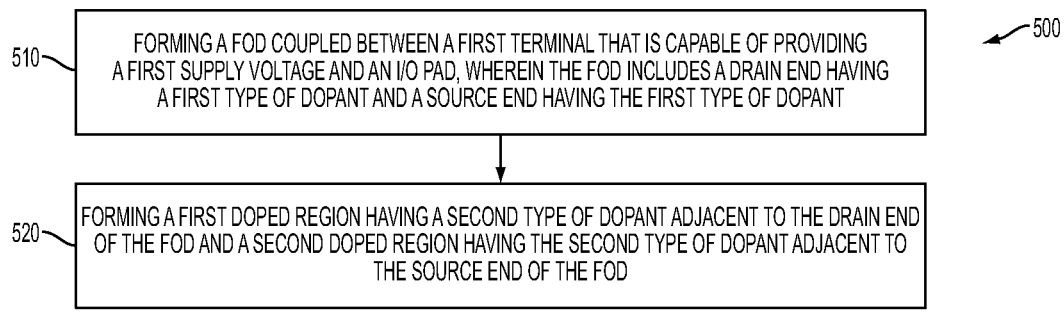
FIG. 5 is a flowchart illustrating an exemplary method for forming an ESD protection circuit.

FIG. 5 is a flowchart illustrating an exemplary method for forming an ESD protection circuit. In FIG. 5, a method 500 can include a process 510 for forming a FOD, e.g., FOD 211 described above in conjunction with FIG. 2. As noted, the FOD 211 can be disposed between the I/O pad and the terminal 205 that can provide the supply voltage VDD. The FOD 211 can include the drain end 213, e.g., an n-type drain end, and the source end 215, e.g., an n-type source end.

In some embodiments, the well region 202 (shown in FIG. 2) can be formed by, for example, implanting dopants into the substrate 201. For forming a p-type well region, the well region 202 can have dopants such as Boron (B) or other group III element can be implanted. For forming an n-type well region, the well region 202 can have dopants such as Arsenic (As), Phosphorus (P), other group V element, or the combinations thereof.

The field oxide 212 can be formed by a STI process, a LOCOS process, or other suitable process that can form a desired isolation structure. The field oxide 212 can include materials such as oxide, nitride, oxynitride, other dielectric material that can isolate the drain end 213 from the source end 215, or any combinations thereof.

In some embodiments, the drain end 213 and the source end 215 can be formed by, for example, implanting dopants within the well region 202. For embodiments using an N-FOD, the drain end 213 and the source end 215 can have dopants such as Arsenic (As), Phosphorus (P), other group V element, or the combinations thereof.

Referring to FIGS. 2 and 5, a process 520 can form the doped region 217a, e.g., a p+ doped region, adjacent to the drain end 213 of the FOD 211 and the doped region 217b, e.g., a p+ doped region, adjacent to the source end 215 of the FOD 211. In some embodiments, the doped regions 217a and 217b can be formed by, for example, implanting dopants within the well region 202. In other embodiments, the process 520 can include performing an ESD implantation process for forming the doped regions 217a and 217b. In some embodiments, the doped regions 217a and 217b can have a dopant concentration from about 1E13 atoms/cm² to about 1E15 atoms/cm².

It is noted that the doped regions 217a and 217b can be formed after or before the formation of the drain end 213 and the source end 215. One of skill in the art can modify the sequence of the formations of the doped regions 217a, 217b, the drain end 213, and the source end 215 to achieve a desired FOD.

It is noted that at least one interconnect structure including, e.g., contacts, vias, and metallic lines, and dielectric layers can be formed over the structures shown in FIGS. 2-4. At least one passivation layer or structure may be formed over the interconnect structure. It is also noted that the dopant types of the substrate, well regions, drain, source, and doped regions of the FODS described above in conjunction with FIGS. 2-4, respectively, are merely exemplary for forming an N-FOD. For embodiments forming a P-FOD, the well regions, drain, source, and doped regions can use a dopant type in opposite to those of the N-FOD.

Figure 6:
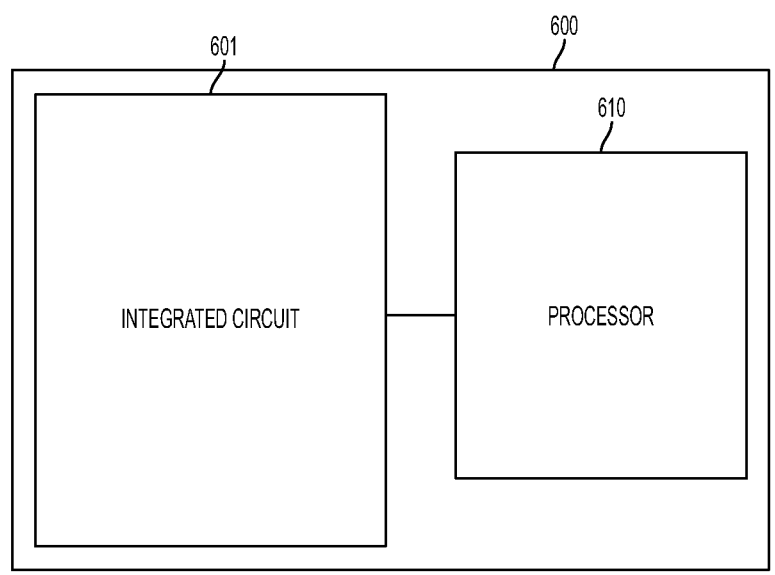
FIG. 6 is a schematic drawing showing a system including an exemplary integrated circuit.

FIG. 6 is a schematic drawing showing a system including an exemplary integrated circuit. In FIG. 6, a system 600 can include a processor 610 coupled with an integrated circuit 601. The integrated circuit 601 can be similar to the integrated circuit 100 described above in conjunction with FIG. 1. In some embodiments, the processor 610 can be a processing unit, central processing unit, digital signal processor, or other processor that is suitable for accessing data of memory circuit.

In some embodiments, the processor 610 and the integrated circuit 301 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 600 including the integrated circuit 601 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrostatic discharge (ESD) protection circuit coupled with an input/output (I/O) pad, the ESD protection circuit comprising:
a first field oxide device coupled between the I/O pad and a first terminal that is capable of providing a first supply voltage, the first field oxide device including a substrate, a drain end having a first type of dopant, a source end having the first type of dopant and a field oxide structure between the drain end and the source end, the first field oxide device including a first doped region having a second type of dopant disposed adjacent to the drain end of the first field oxide device and a second doped region having the second type of dopant disposed adjacent to the source end of the first field oxide device, wherein the field oxide structure is an isolation structure having a top surface co-planar with a top surface of the substrate, the field oxide structure is in a first well and both of the source end and the drain end are in a respective second well separate from the first well, and a depth of the second wells is equal to a depth of the first well.

2. The ESD protection circuit of claim 1, wherein the first doped region is disposed below the drain end of the first field oxide device and the second doped region is disposed below the source end of the first field oxide device.

3. The ESD protection circuit of claim 1, wherein the first field oxide device further comprises a bulk region and the bulk region is coupled with a second terminal that is capable of providing a second supply voltage.

4. The ESD protection circuit of claim 3 further comprising:
a second field oxide device coupled between the second terminal and the I/O pad, the second field oxide device including a drain end having the first type of dopant and a source end having the first type of dopant, wherein the second field oxide device comprises a third doped region having the second type of dopant adjacent the drain end of the second field oxide device and a fourth doped region having the second type of dopant adjacent to the source end of the second field oxide device.

5. The ESD protection circuit of claim 1, wherein the first doped region having the second type of dopant is coupled with a first well region having the second type of dopant and the second doped region having the second type of dopant is coupled with a second well region having the second type of dopant.

6. The ESD protection circuit of claim 5, wherein each of the first well region and the second well region includes a high voltage well region.

7. An integrated circuit comprising:
an input/output (I/O) pad;
a first internal circuit coupled with the I/O pad; and
a first field oxide device coupled between the I/O pad and a first terminal that is capable of providing a first supply voltage, the first field oxide device including a drain end having a first type of dopant, a source end having the first type of dopant and a field oxide structure between the drain end and the source end, the first field oxide device including a first doped region having a second type of dopant disposed adjacent to the drain end of the first field oxide device and a second doped region having the second type of dopant disposed adjacent to the source end of the first field oxide device, wherein the field oxide structure is an isolation structure located completely within a first well, the drain end is located in a second well different from the first well, and the first well has a depth equal to a depth of the second well.

8. The integrated circuit of claim 7, wherein the first doped region is disposed below the drain end of the first field oxide device and the second doped region is disposed below the source end of the first field oxide device.

9. The integrated circuit of claim 7, wherein the first field oxide device further comprises a bulk region and the bulk region is coupled with a second terminal that is capable of providing a second supply voltage.

10. The integrated circuit of claim 9 further comprising:
a second field oxide device coupled between the second terminal and the I/O pad, the second field oxide device including a drain end having the first type of dopant and a source end having the first type of dopant, wherein the second field oxide device comprises a third doped region having the second type of dopant adjacent the drain end of the second field oxide device and a fourth doped region having the second type of dopant adjacent to the source end of the second field oxide device.

11. The integrated circuit of claim 7, wherein the first doped region having the second type of dopant is coupled with a first well region having the second type of dopant and the second doped region having the second type of dopant is coupled with a second well region having the second type of dopant.

12. The integrated circuit of claim 11, wherein each of the first well region and the second well region includes a high voltage well region.

13. The integrated circuit of claim 11, further comprising a third well region having the second type of dopant around the first field oxide device.

14. A method forming an electrostatic discharge (ESD) protection circuit, the method comprising:
   forming a field oxide device in a substrate, wherein the field oxide device is coupled between an input/output (I/O) pad and a terminal that is capable of providing a supply voltage, the field oxide device including a drain end having a first type of dopant in a first well, a source end having the first type of dopant in a second well separate from the first well, and a field oxide structure completely in a third well different form the first well between the drain end and the source end, wherein the field oxide structure is an isolation structure, and each of the first well, the second well and the third well extend to a same depth; and
   forming a first doped region having a second type of dopant adjacent to a bottom surface of the drain end of the field oxide device and a second doped region having the second type of dopant adjacent to the source end of the field oxide device, wherein the bottom surface of the drain end is exposed on opposite sides of the first doped region in a direction parallel to a top surface of the substrate.

15. The method of claim 14, wherein forming the field oxide device comprises:
   forming a first well region having the second type of dopant coupled with the first doped region and a second well region having the second type of dopant coupled with the second doped region.

16. The method of claim 15, wherein forming the first well region and the second well region comprises:
   forming a first high voltage well region and a second high voltage well region.

17. The method of claim 16, wherein forming the field oxide device comprises:
   forming the third well comprises forming the third well having the second type of dopant.

18. The method of claim 14, wherein forming the first doped region and the second doped region comprises:
   performing an ESD implantation for forming the first doped region and the second doped region.

* * * * *